United States Patent [19]
Ito

[11] Patent Number: 5,117,112
[45] Date of Patent: May 26, 1992

[54] METHOD AND APPARATUS FOR MONITORING ASTIGMATISM AND FOCUS IN ELECTRON MICROSCOPE

[75] Inventor: Takashi Ito, Tokyo, Japan
[73] Assignee: JEOL Ltd., Tokyo, Japan
[21] Appl. No.: 616,323
[22] Filed: Nov. 21, 1990
[30] Foreign Application Priority Data
   Nov. 21, 1989 [JP] Japan .................. 1-303832
[51] Int. Cl.$^5$ ............................. H01J 37/26
[52] U.S. Cl. ...................... 250/311; 250/307
[58] Field of Search .............. 250/307, 311, 397
[56] References Cited

U.S. PATENT DOCUMENTS

| | | | |
|---|---|---|---|
| 4,399,360 | 8/1983 | Fotimo | 250/311 |
| 4,554,452 | 11/1985 | Suganuma | 250/311 |
| 4,680,469 | 7/1987 | Nomura et al. | 250/311 |
| 4,760,385 | 7/1988 | Jansson | 340/709 |

*Primary Examiner*—Bruce C. Anderson
*Attorney, Agent, or Firm*—Webb, Burden, Ziesenheim & Webb

[57] ABSTRACT

There are disclosed a method and an apparatus for monitoring astigmatism and the condition of the focus in a transmission electron microscope. The apparatus includes a TV camera for converting the specimen image taken by the electron microscope into a video signal, which is sent to a control unit. An image monitor, a graph monitor and image memory are connected with the control unit, as well as the TV camera. The control unit superimposes radial cursor lines on the image of a specimen displayed on the image monitor, and reads data about the pixels lying on the cursor lines from the image memory. The control unit then creates graphs showing the distributions of data about the pixels existing on the cursor lines from the data read from the memory. An array of the graphs is displayed on the graph monitor.

3 Claims, 2 Drawing Sheets

METHOD AND APPARATUS FOR MONITORING ASTIGMATISM AND FOCUS IN ELECTRON MICROSCOPE

FIELD OF THE INVENTION

The present invention relates to a method and an apparatus for permitting one to visually determine whether astigmatism is produced in the electron beam in an electron microscope and whether the beam is focused.

BACKGROUND OF THE INVENTION

Generally, a transmission electron microscope is equipped with an astigmatism-correcting mechanism and a focusing mechanism to enable the operator to observe or photograph a magnified image of a specimen under the condition that the image is in focus and free of astigmatism. An electron microscope equipped with an automatic focusing device is disclosed in U.S. Pat. No. 4,680,469.

After an adjustment is made using the astigmatism-correcting mechanism or the focusing mechanism, an operator frequently directly observes an image to actually ascertain whether the image contains astigmatism or is in focus. Therefore, this determination requires experience and skill and is generally quite difficult to perform. In a transmission electron microscope, the image contrast deteriorates near the focal point, thus making it difficult to observe the image on the fluorescent screen. In recent years, a system has been adopted which allows the operator to observe an image picked up by a TV camera on a monitor. However, it is difficult to know the degree of deterioration in the image quality attributable to astigmatism unless the contrast and the brightness of the monitor are adequately adjusted. Hence, this system also necessitates skillfulness to check the conditions.

SUMMARY OF THE INVENTION

In view of the foregoing problems, it is an object of the invention to provide a method and an apparatus which are used in an electron microscope to permit one to easily visually ascertain whether astigmatism is produced and whether the image is in focus.

An apparatus for monitoring astigmatism and the condition of the focus in an electron microscope in accordance with the invention comprises: the electron microscope creating a transmission electron microscope image of a specimen; an image pickup means for converting the specimen image into a video signal; an image memory in which image data represented by the video signal is stored; an image monitor providing a display of the specimen image, based on the image data; a means for superimposing radial cursor lines on the image displayed on the monitor; a means for reading data about the pixels of the image existing on the cursor lines from the image memory; and creating graphs showing the distributions of data about the pixels existing on the cursor lines and displaying an array of the graphs.

A method of monitoring astigmatism and the condition of the focus in an electron microscope in accordance with the invention comprises the steps of: taking a projection image of a specimen; extracting data about pixels of the image existing on plural nonparallel straight lines from the image data obtained in the previous step; and creating graphs showing the distributions of data about the pixels on the straight lines from the extracted data and displaying an array of the graphs.

In accordance with the invention, an image is displayed on the monitor. Data about the pixels of the image existing on the nonparallel straight lines is extracted. Based on the extracted data, an array of graphs showing the distributions of data about the pixels existing on the straight lines is created and displayed. The displayed graphs facilitate ascertaining whether the image contains astigmatism or is in focus. More specifically, when graphs taken in several different directions are displayed, e.g., when graphs taken in a vertical direction, in a horizontal direction, and in an oblique direction, respectively, are displayed, if all of them are in focus, then the operator can judge that no astigmatism is produced. If the graph taken in some direction is in focus while the graphs taken in the other directions are out of focus, then the operator can judge that astigmatism is present.

In this way, the invention permits the operator to quickly know whether astigmatism is present and whether the image is in focus.

DETAILED DESCRIPTION OF THE INVENTION

Figure 1:
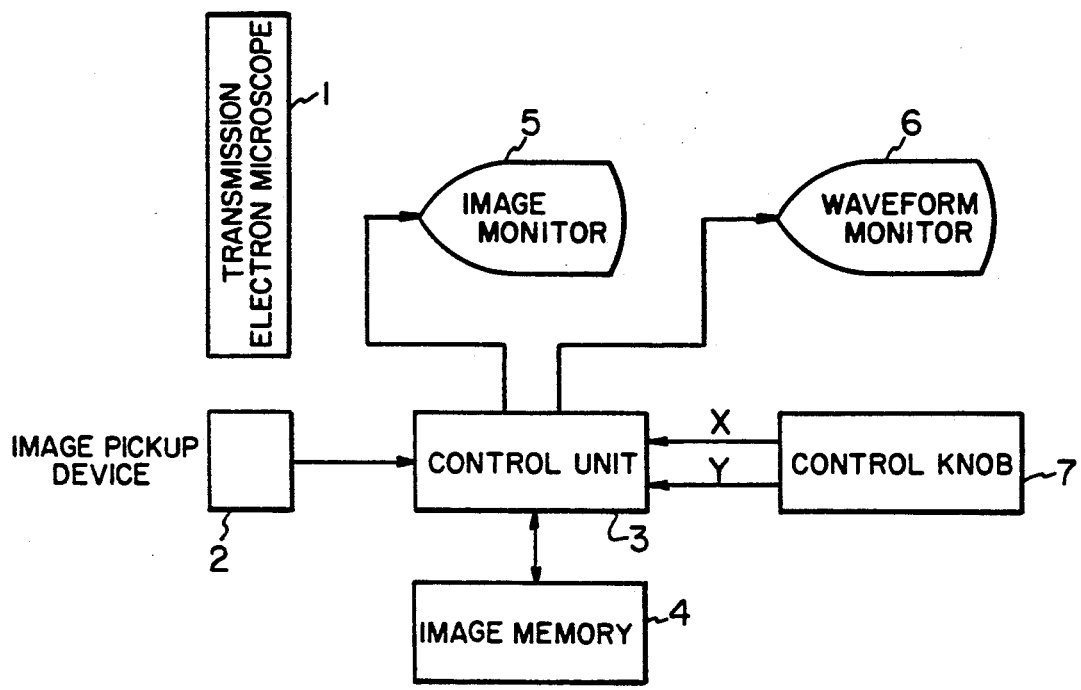
FIG. 1 is a block diagram of an apparatus according to the invention, the apparatus permitting one to know whether the image contains astigmatism and whether the image is in focus.

Referring to FIG. 1, there is shown an apparatus for carrying out a method of monitoring astigmatism and the condition of focus in accordance with the invention. The apparatus comprises a transmission electron microscope 1, an image pickup device 2, a control unit 3, an image memory 4, an image monitor 5, a graph monitor 6, and a control knob 7 connected with the control unit 3. The pickup device 2, the image monitor 5, the graph monitor 6, and the memory 4 are also connected with the control unit 3.

The transmission electron microscope 1 creates a projection image of a specimen (not shown). A noncrystalline substance is selected as the specimen in order to prevent the projected image from being affected by the electron beam diffraction. Therefore, carbon (or silicon) deposited over a thin film is used as the specimen in this embodiment. The projection image is converted into a video signal by the image pickup device 2 consisting of an ordinary TV camera. The pickup device 2 can also take a projection image on the fluorescent screen (not shown). The fluorescent screen can be replaced with a charge-coupled image sensor consisting of a number of arrayed CCDs or the like. In this case, an image of a specimen can be directly converted into a video signal by the image sensor.

The control unit 3 performs various operations to permit the operator to determine whether the image contains astigmatism or is in focus. The control unit 3 controls the operation of the various devices shown in FIG. 1 as described below.

The image memory 4 stores the image data accepted by the image pickup device 2. Since the data stored in the memory 4 takes digital form, the analog video signal delivered from the pickup device 2 is converted into digital form by an A/D converter in an appropriate location, e.g., at the output stage of the pickup device 2 or at the input stage of the control unit 3.

The image monitor 5 displays the specimen projection image taken by the pickup device 2 without making any alternation to the image. The graph monitor 6 displays the graphs of the brightness levels on the lines of pixels existing in specified directions when data about the lines of pixels is read from the image memory 4.

When an image and graphs are displayed on the image monitor 5 and the graph monitor 6, respectively, the output signal from the image memory 4 is converted into analog form by a D/A converter, for example, at the output stage of the control unit 3. The control knob 7 is installed to indicate the positions of the cursors presented on the image monitor 5.

In the operation of the apparatus constructed as shown in FIG. 1, the control unit 3 usually accepts the video signal from the pickup device 2, the signal presenting data about the specimen image taken by the pickup device 2. The data is delivered to the image monitor 5 as it is. Thus, the operator can observe a projection image.

Figure 2:
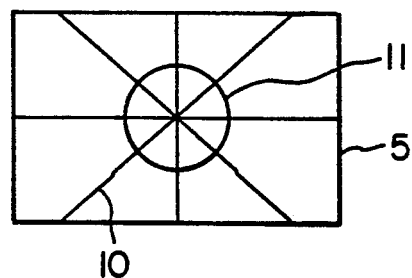
FIG. 2 is a diagram showing one example of the image displayed on the graph monitor 6 shown in FIG. 1.

When the operator operates the entry means such as a keyboard (not shown) in a given manner to know whether the image contains astigmatism and whether the image is in focus, the control unit 3 accepts the video signal from the image pickup device 2 and stores the data in the image memory 4. Simultaneously, the control unit 3 displays radial cursors 10 resembling an asterisk (*) on the monitor 5, as shown in FIG. 2. An image of the specimen is also shown in FIG. 2 and indicated by 11. The image memory 4 can accept data about only one frame of image. In order to improve the signal-to-noise ratio, a plurality of frames of images can be accumulated.

Under this condition, the operator operates the knob 7 to give instructions to the control unit 3, for placing the cursors 10 into orientations and positions adequate for observation of graphs. Also, display of the graphs is ordered. The control unit 3 then reads data about every pixel of the image located on each cursor 10 from the image memory 4.

FIG. 3 conceptually represents the space inside the image memory 4, and it is assumed that data about the image 11 is stored in the memory 4. The control unit 3 reads the image data along four lines a, b, c, d constituting the cursors 10. The brightness levels at pixels lying in the four directions a, b, c, d are plotted in FIGS. 3(b), (c), (d), (e), respectively. These graphs 13–16 are displayed on the screen of the graph monitor 6.

Figure 3A:
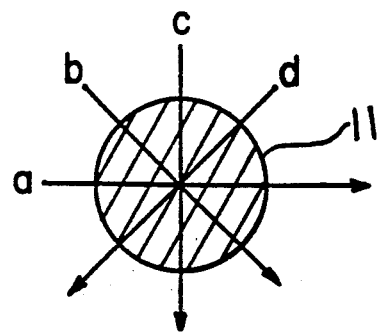
FIG. 3a–e is a conceptual representation of the space inside the image memory 4 shown in FIG. 1, for illustrating the manner in which data is read from the memory.
Figure 3B:
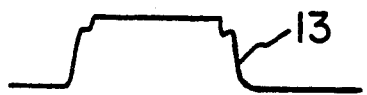
Figure 3C:
Figure 3D:
Figure 3E:
Figure 4A:
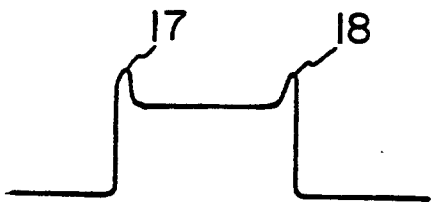
FIG. 4a–c shows graphs for illustrating the relation of signal graphs and the condition of focus.
Figure 4B:
Figure 4C:

The graph obtained from the specimen image through the image pickup device varies, depending on the degree to which the image is focused. We now assume that the image 11 shown in FIG. 3(a) is circular. If the image is in focus, the graph changes smoothly at its leading and trailing edges, as shown in FIG. 4(b). If the focal point is shifted downward, overshoots 17 and 18 take place at the leading and trailing edges, respectively, as shown in FIG. 4(a). As a result, the contour of the image is accentuated. If the focal point is shifted upward, independent peaks 19 and 20 which are generally called overfringes are produced, as shown in FIG. 4(c). The result is that a black fringe pattern appears around the image. In this way, a check is performed to see whether peaks are present. If they exist, the positions of the peaks are observed to know the degree to which the image is focused.

Since astigmatism means the condition in which the image is focused to a different degree according to direction, whether astigmatism is present or not can be seen by comparing the four kinds of graphs displayed on the graph monitor 6. If the image is focused alike for all the four lines forming the cursors 10, then it follows that no astigmatism is present. If the image is focused to different degrees for the four lines forming the cursors as shown in FIGS. 3(b)–(e), then the operator can judge that astigmatism is present.

Accordingly, the operator observes the graphs displayed on the graph monitor 6 and operates the astigmatism-correcting mechanism and the focus-adjusting mechanism in such a way that the graphs are free from peaks along all the four lines, as shown in FIG. 4(b).

As can be understood from the description made thus far, the present invention enables the operator to determine whether astigmatism is present and whether the image is in focus by observing the graphs on the graph monitor 6. In this way, the operator can make a judgment with much greater ease and in a shorter time than the case in which the prior art method relying on observation of a projection image is used. Consequently, the specimen can be observed with improved efficiency. This can lead to an improvement in the efficiency of the operation of the transmission electron microscope.

While a preferred embodiment has been described, variations thereto will occur to those skilled in the art within the scope of the present inventive concepts. In the above example, the image monitor is separated from the graph monitor. These two monitors may be integrated into a unit.

Having thus described my invention with the detail and particularity required by the Patent Laws, what is claimed and desired to be protected by Letters Patent is set forth in the following claims.

What is claimed is:

1. A method of monitoring astigmatism and the condition of the focus in the electron beam of an electron microscope, comprising the steps of:

creating a transmission electron microscope image of a specimen;

converting said transmission electron microscope image of the specimen into a video signal;

digitizing the video signal and storing the digitized signal as pixel data in an electronic memory;

extracting brightness data about pixels of the image existing on plural nonparallel straight lines from the image data obtained in the above step;

creating graphs showing the distributions of brightness data of the pixels on the straight lines from the extracted data and displaying an array of the graphs; and observing the leading and trailing edges of each graph corresponding to said nonparallel lines, which edges are indicative of the focus of the electron beam along said lines and making a comparison of the graphs corresponding to said nonparallel lines, which comparison is indicative of astigmatism of said electron beam.

2. An apparatus for monitoring astigmatism and the condition of the focus in an electron microscope, comprising:

the electron microscope creating a transmission electron microscope image of a specimen;

an image pickup means for converting the specimen image into a video signal;

an image memory in which image brightness data represented by the video signal is stored;

an image monitor providing a display of the specimen image, based on the image brightness data;

a means for superimposing radial cursor lines on the image displayed on the image monitor;

a means for reading brightness data about pixels of the image existing on the cursor lines from the image memory; and a means for displaying graphs showing the distributions of brightness data of the pixels existing on the cursor lines and displaying said brightness as an array of graphs;

whereby the leading and trailing edges of each graph corresponding to nonparallel lines can be observed, said edges being indicative of the focus of the electron beam along said lines and a comparison of the graphs corresponding to said nonparallel lines can be made, said comparison being indicative of astigmatism of said electron beam.

3. An apparatus for monitoring astigmatism and the condition of the focus in an electron microscope as set forth in claim 2, further comprising a means permitting one to arbitrarily vary the orientations of the cursor lines.

* * * * *